United States Patent [19]

Listerud et al.

[11] Patent Number: 5,250,899
[45] Date of Patent: Oct. 5, 1993

[54] METHOD FOR FAT SUPPRESSION IN MAGNETIC RESONANCE IMAGING

[75] Inventors: John Listerud, Philadelphia, Pa.; Teresa Chan, Wauwatosa, Wis.

[73] Assignee: Trustees of the University of Pennsylvania, Philadelphia, Pa.

[21] Appl. No.: 744,193

[22] Filed: Aug. 12, 1991

[51] Int. Cl.$^5$ .............................................. G01R 33/20
[52] U.S. Cl. ...................................... 324/309; 324/307
[58] Field of Search ............. 128/653.2, 653.5, 653.2; 324/307, 309, 310

[56] References Cited

U.S. PATENT DOCUMENTS

| | | | |
|---|---|---|---|
| 4,577,152 | 3/1986 | Macovski | 324/309 |
| 4,585,993 | 4/1986 | Bottomley | 324/309 |
| 4,720,679 | 1/1988 | Patrick et al. | 324/309 |
| 4,771,242 | 9/1988 | Lampman et al. | 324/309 |
| 4,847,559 | 7/1989 | Keren | 324/309 |
| 4,857,847 | 8/1989 | Machida | 324/309 |
| 4,902,973 | 2/1990 | Keren | 324/307 |
| 4,972,148 | 11/1990 | Jensen | 324/309 |
| 4,983,920 | 1/1991 | Lampman et al. | 324/309 |
| 5,010,300 | 4/1991 | Paley et al. | 324/322 |
| 5,078,141 | 1/1992 | Suzuki et al. | 324/309 |
| 5,079,505 | 1/1992 | Deimling et al. | 324/309 |
| 5,151,655 | 9/1992 | Harms et al. | 324/309 |

OTHER PUBLICATIONS

Dixon, Radiology, vol. 153, p. 189 (1984).
Szumowski, Radiology, vol. 165, p. 247 (1987).
Szumowski, Magnetic Resonance Medical, vol. 9, pp. 379–388 (1989).

*Primary Examiner*—Michael J. Tokar
*Assistant Examiner*—Raymond Y. Mah
*Attorney, Agent, or Firm*—Woodcock Washburn Kurtz Mackiewicz & Norris

[57] ABSTRACT

A method for suppressing fat in a magnetic resonance image of a target organ, wherein fat is present in the vicinity of the target organ involves subjecting the target organ to electromagnetic energy so as to cause an organ signal response and a fat signal response related to the magnetization of the organ and the fat, respectively. The subjecting to electromagnetic energy involves subjecting the target organ to a saturation preamble and thereafter subjecting the target organ to an offsetting spin-echo sequence. The organ and fat responses are detected and image information based on the responses is generated. The saturation preamble, selectively excites and then dephases a particular substance, such as fat, in the vicinity of the target organ. Preferably exciting and then dephasing involves subjecting the target organ to a Hore 1-3-3-1 signal. The subjecting of the target organ to an offsetting spin-echo sequence preferably involves subjecting the target organ to a spin-echo sequence which offsets gradient and spin echoes resulting in a phase difference between the response from the target organ and a response from fat. Signals representative of the offset gradient and spin echoes involves combining such signals, i.e. adding opposing responses together to suppress the fat response.

3 Claims, 2 Drawing Sheets

METHOD FOR FAT SUPPRESSION IN MAGNETIC RESONANCE IMAGING

The research disclosed in this patent application was supported in part by National Institutes of Health. The United States government has certain rights in the invention.

FIELD OF THE INVENTION

The present ivvention relates generally to the field of magnetic resonance imaging and more particularly to the generation of pulse sequences specifically tailored for suppressing undesired signals such as fat in an organ of interest.

BACKGROUND OF THE INVENTION

Magnetic resonance (MR) is defined as the enhanced adsorption of energy occurring when the nuclei of atoms or molecules within an external magnetic field are exposed to radio frequency (RF) energy at a specific frequency, called the Larmor or residence frequency. Messrs. Bloch and Purcell each received the Noble Prize for investigating and describing in 1946 the phenomenon of MR in solids and liquids. The characteristics of the MR signal arising from a given nucleus were found to depend on a specific molecular environment of that nucleus. Such signal dependence proved ideal for qualitative and quantitative chemical analysis. Moreover, the radio frequencies involved in MR are non ionizing and can penetrate the human body. For a more complete discussion of MRI methods and equipment, see R.R. Edelman et al., Clinical Magnetic Resonance Imaging, W.B.Saunders (USA) (1990), which work is incorporated herein by reference.

Although MR suggested enormous clinical potential for in vivo studies, the potential of the method was limited by its inability to provide spacial localization of the MR signal. A researcher named Lauterbur resolved the localization problem through the use of magnetic field gradients. Since 1977, various MR techniques have been developed for the generation of two and three dimensional data of a human subject.

The production of a human MR image can be summarized by the following steps. First, randomly oriented tissue nuclei are aligned by a powerful uniform magnetic field. Second this alignment of magnetization is disrupted by properly tuned RF pulses, which pulses perturb the aligned tissue nuclei. As the nuclei recover their alignment by a relaxation processes, they produce radio signals proportional to the magnitude of their initial alignment. Contrast between nuclei develops as a result of the different rates at which each nuclei realigns with the magnetic field. Third, the positions of the nuclei are localized by the application of a spatially dependent magnetic field called a gradient. Fourth, the radio signals produced by the realigning nuclei are measured or read out after a predetermined time has elapsed from the initial RF excitation. Fifth, the measured or read out signals are transformed by means of a Fourier Transform into data having a particular position in the image being generated.

Many organs to be imaged with MRI are surrounded by fatty tissue, especially those which are high in the abdomen or are subject to respiratory motion, such as the pancreas. It is known that fatty tissue has a short relaxation time. Thus, when imaging organs surrounded by fatty tissue, fat signals can be significant. Therefore, a significant signal from the fatty tissue is received by the imaging machine when imaging these organs. Such a signal can effect the integrity , i.e. the resulting image, of surrounding tissue. There have been a number of magnetic resonance imaging (MRI) techniques suggested for the suppression signals.

One of the first is Thomas Dixon, Radiolog, Vol. 153, p. 189 (1984) (Dixon), incorporated herein by reference, which describes offsetting the gradient and spin echoes in a conventional spin echo sequence to obtain a phase difference between fat and water signals. This technique has a number of variants, some of which were suggested by Dixon, in which the echo offset, or "opposed" data, is combined at different points in the raw data reconstruction pathway with a conventional imaging data, sometimes called "in-phase" data. This combination can occur eitner before the raw data is transformed by a 2 dimensional Fourier Transform (2DFT), after 2DFT but before a magnitude image is computed from the complex image, or after the magnitude image is computed. When the. combination is of the raw data, such combination may occur during signal averaging, and this method has been called "Chopper Dixon" by Jerry Szumowski, *Radiology* Vol. 165, p. 247 (1987), incorporated herein by reference. See also J. Szumowski, *Magnetic Resonance Medical*, Vol. 9, pps. 379-388, (1989), incorporated herein by reference.

A second method is based on a spectroscopic technique known as "homospoil", and is called "chemical saturation". In this technique, the fat signal is selectively excited and the dephased by a sequence preamble applied prior to the conventional imaging sequence. A variety of chemical saturation or shift selective pulses have been used to excite the fat resonance, including the Hore 1-3-3-1 sequence and the narrow bandwidth sync pulse.

Unfortunately, using these prior techniques, fat signals are not completely suppressed even if a saturation pulse is applied.

Consequently, a need still exists for magnetic resonance imaging methods for imaging a given target which methods suppress imaging information representative of undesirable substances surrounding or in the vicinity of the target.

SUMMARY OF THE INVENTION

The advantages of the invention are achieved in a method for suppressing fat in a magnetic resonance image of target organ, wherein fat is present in the vicinity of the target organ involves subjecting the target organ to electromagnetic energy so as to cause an organ signal response and a fat signal response related to the magnetization of the organ and the fat, respectively. The subjecting to electromagnetic energy involves subjecting the target organ to a saturation preamble and thereafter subjecting the target organ to an offsetting spin-echo sequence. The organ and fat responses are detected and image information based on the responses is generated. The saturation preamble, selectively excites and then dephases a particular substance, such as fat, in the vicinity of the target organ. Preferably exciting and then dephasing involves subjecting the target organ to a Hore 1-3-3-1 signal. The subjecting of the target organ to an offsetting spin-echo sequence preferably involves subjecting the target organ to a spin-echo sequence which offsets gradient and spin echoes resulting in a phase difference between the response from the target organ and a response from fat. Signals representative of the offset gradient and spin echoes involves combining such signals, i.e. adding opposing responses together to suppress the fat response.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION OF THE PREFERRED EMBODIMENT

Figure 1:
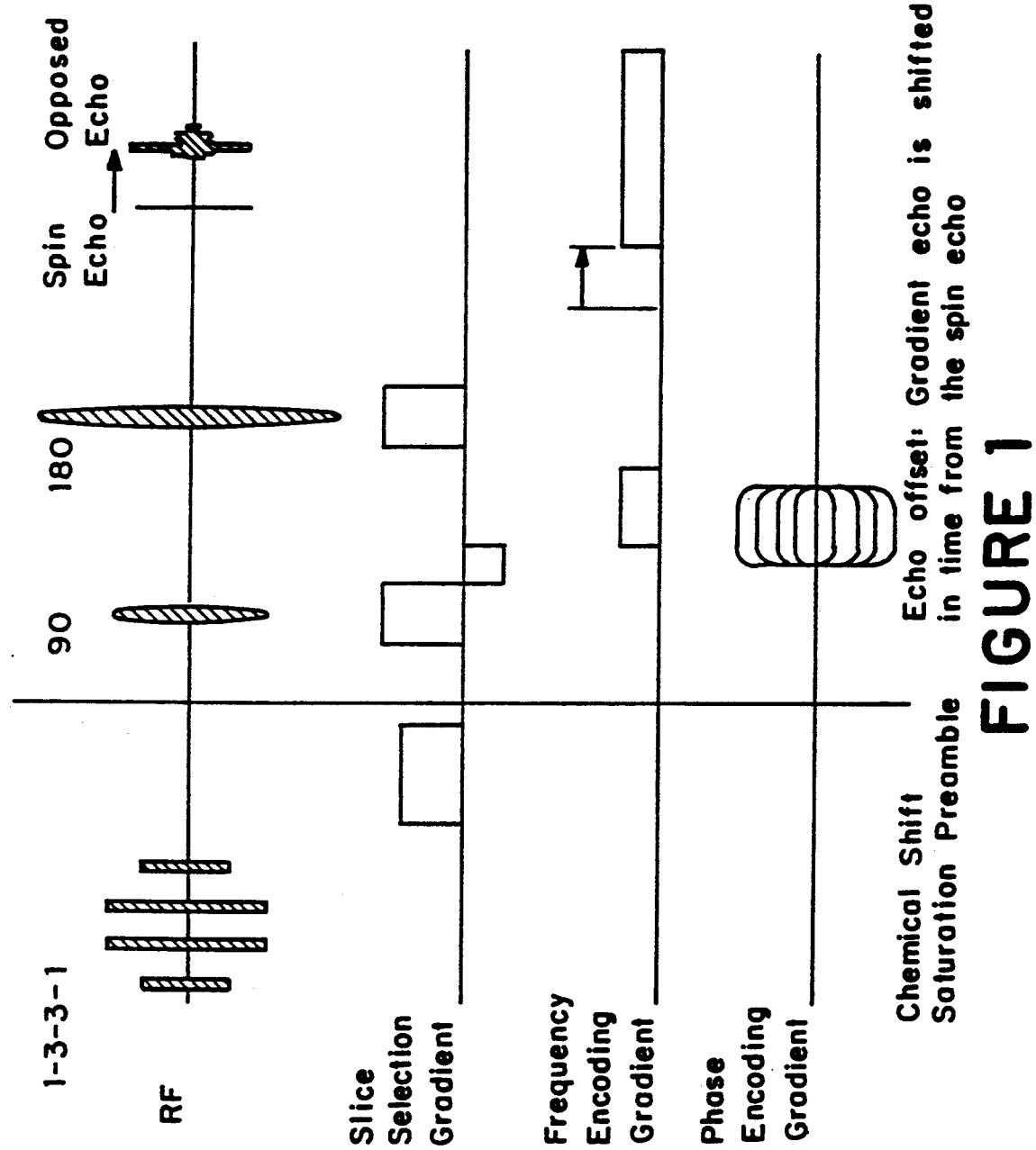
FIG. 1 is a graph of a saturation sequence coupled with a spin-echo pulse sequence in accordance with the present invention.

The method of the present invention involves generating a pulse sequence used in magnetic resonance imaging which is specifically tailored for suppressing fat signals in the chemical shift spectrum of an organ of interest. It will be appreciated by those skilled in the art, having learned of the invention, that equipment is available for generating pulse sequences in accordance with the present invention and further that processing equipment for combining fat and organ signals to generate an image is also available.

The invention involves subjecting a target organ to a pulse sequence which pulse sequence combines the spin-echo sequence of the opposed image technique (Dixon) with a fat signal saturation preamble to obtain highly resolved MRI images of the organ of interest. By applying offset spin-echo pulses in accordance with the present invention, i.e. after the application of a saturation preamble, it has been discovered that the phase of the partially suppressed fat signals and water-like signals can be opposed so that they cancel one another. Due to this phase cancelling, the signal from the fatty tissue surrounding the organ of interest is effectively eliminated and a sharp, resolved MRI picture can be conveniently produced, thereby yielding a high quality diagnostic tool for the physician.

Thus the invention produces a significant advantage over the Dixon pulse sequence and others, since it efficiently and effectively eliminates interfering signals from fatty tissue during magnetic resonance imaging to produce high quality clinical images of the organ of interest. Such a result has not previously been achieved in MRI art.

The main advantage to this method over the Chopper Dixon method is the ease with which this method may be combined with other conventional imaging options which act by re-adjusting the phase of the acquired signal.

For example, such adjustments are common in motion sensitivity compensation techniques such as first order gradient moment nulling, respiratory ordered phase encoding, and retrospective cardiac gating. First order gradient moment nulling attempts to suppress phase shifts due to intrasequence motion. Respiratory ordered phase encoding uses respiratory driven selection of phase encoding pulse magnitudes to compensate for cyclic respiratory motion. Retrospective cardiac gating drives selection of phase encoding pulse magnitudes according to the QRS complex of the electrocardiogram, then interpolates the acquired raw data to obtain a fictitious raw data set at a well defined phase of the cardiac cycle.

It is our belief that fatty tissue produces a signal mainly due to fat, with a small but significant water signal. The magnitude of the incompletely suppressed fat signal using saturation approach will approach that of the water signal. By then applying a spin echo sequence, the fat and water signals will cancel each other more effectively than with either technique otherwise. This cancellation can be thought of as similar to the "etching effect" seen on conventional opposed images at boarders between fat and water tissues.

Figure 2:
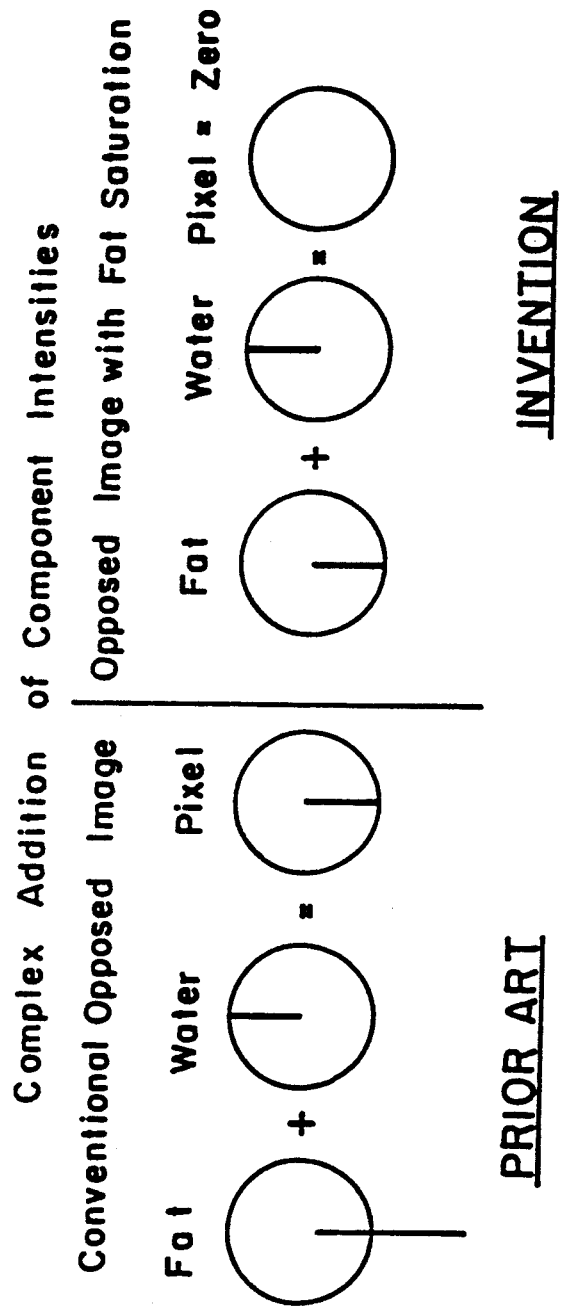
FIG. 2 is a conceptual view graphically showing the supression of fat in a prior MRI method and the supression of fat in the MRI method of the present invention.

The method of the present invention for suppressing fat in a magnetic resonance image of a target organ involves subjecting the target organ to electromagnetic energy so as to cause a response related to the magnetization of the organ and to cause a response related to the magnetization of the fat. Such a step involves the generation of a saturation preamble and thereafter a spin-echo sequence. As shown in FIG. 1, the saturation preamble preferably includes a Hore 1-3-3-1 signal. It will also appreciated from FIG. 1 that the spin-echo sequence includes a sequence as described by Dixon which serves to offset the gradient and spin echoes to obtain a phase difference between the fat and water signals. With such a phase difference, the combination of the fat and water responses, as graphically depicted in FIG. 2, results in the effective supression of the fat signal. Thereafter, image information can be generated based on the combination of responses. Since the fat signal has been suppressed, only the a signal representative of the target organ should remain.

The step of subjecting the target organ to a saturation preamble preferably involves selectively exciting and then dephasing a particular substance, such as fat, in the vicinity of the target organ.

The step of subjecting the target organ to an offsetting spin-echo sequence preferably involves subjecting the target organ to a spin-echo sequence which offsets gradient and spin echoes resulting in a phase difference between the response from the target organ and a response from fat. The step of generating image information based on the organ and fat responses involves combining the responses. As indicated previously such a combination can be made either before the raw data is transformed by a 2 dimensional Fourier Transform (2DFT), after 2DFT but before a magnitude image is computed from the complex image, or after the magnitude image is computed. When the combination is of raw data, such combination may occur during signal averaging.

It is noted that the process of data combination is known, it is the generation of this data in accordance with the method of the invention which is novel.

While the invention has been described and illustrated with reference to specific embodiments, those skilled in the art will recognize that modification and variations may be made without departing from the principles of the invention as described herein above and set forth in the following claims.

What is claimed is:

1. A method for suppressing a fat signal in a magnetic resonance image of a target organ, wherein fat is present in the vicinity of said target organ, said method comprising the steps of:

subjecting said target organ to electromagnetic energy so as to cause a fat response related to the magnetization of said fat, wherein said step of subjecting comprises the steps of subjecting said target organ to a saturation preamble for selective excitation of said fat thereby causing a fat signal and for de-phasing said fat signal and thereafter subjecting said target organ to an imaging acquistion sequence wherein said sequence excites said fat signal and a waterlike signal, and causes the gradient echo to occur at a time when the phases of said fat signal and said water-like signal are opposed;

detecting said organ response; and generating image information based on said response.

2. The method of claim 1, wherein the step of selectively exciting and then dephasing comprises the step of subjecting the target organ to a Hore 1-3-3-1 signal.

3. The method of claim 1, wherein the step of subjecting said target organ to an image acquisition sequence comprises the step of subjecting said target organ to a spin-echo sequence which offsets gradient echo from the spin echo resulting in a phase difference between said fat signal and said water-like signal

* * * * *